US 6,555,183 B2

(12) United States Patent
Wang et al.

(10) Patent No.: US 6,555,183 B2
(45) Date of Patent: *Apr. 29, 2003

(54) PLASMA TREATMENT OF A TITANIUM NITRIDE FILM FORMED BY CHEMICAL VAPOR DEPOSITION

(75) Inventors: Shulin Wang, Campbell, CA (US); Ming Xi, Milpitas, CA (US); Zvi Lando, Palo Alto, CA (US); Mei Chang, Saratoga, CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/495,555

(22) Filed: Feb. 1, 2000

(65) Prior Publication Data

US 2002/0155219 A1 Oct. 24, 2002

Related U.S. Application Data

(63) Continuation-in-part of application No. 09/330,696, filed on Jun. 11, 1999.

(51) Int. Cl.$^7$ ............................................. C23C 16/50
(52) U.S. Cl. ........................ 427/535; 427/255.391; 427/255.394
(58) Field of Search ..................... 427/535, 255.391, 427/255.394

(56) References Cited

U.S. PATENT DOCUMENTS 4,535,000 A * 8/1985 Gordon ....................... 427/160
4,897,709 A   1/1990 Yokoyama et al. ............ 357/68
5,279,857 A   1/1994 Eichman et al. ............. 427/255
5,296,404 A * 3/1994 Akahori et al. .............. 438/668
5,308,655 A   5/1994 Eichman et al. .......... 427/248.1
5,378,501 A * 1/1995 Foster et al. ................. 427/255

(List continued on next page.)

FOREIGN PATENT DOCUMENTS

| EP | 0 711 846 A1 | 5/1996 | ............ C23C/16/34 |
| JP | 63-229814 | 9/1988 | ............ H01L/21/28 |
| JP | 10-209278 | 9/1998 | |
| WO | 95/33865 | * 12/1995 | ............ C23C/16/02 |

OTHER PUBLICATIONS

Bouteville et al. "Low Temperature Rapid Thermal Low Pressure Chemical Vapor Deposition of (111) Oriented TiN Layers from the TiCl$_4$–NH$_3$–H$_2$ Gaseous Phase" Microelectronic Enginerring 37/38, pp. 421–425, 1997.*

Erkov et al. "Deposition and Properties of Titanium Nitride Films Obtained by TiCl$_4$ Ammonolysis in the LPCVD Process" Russian Microelectronics, vol. 27, No. 3, pp. 183–187, 1998.*

(List continued on next page.)

Primary Examiner—Timothy Meeks
(74) Attorney, Agent, or Firm—Moser Patterson Sheridan

(57) ABSTRACT

A method of forming thick titanium nitride films with low resistivity. Using a thermal chemical vapor deposition reaction between ammonia (NH$_3$) and titanium tetrachloride (TiCl$_4$), a titanium nitride film is formed at a temperature of less than about 600° C., and an NH$_3$:TiCl$_4$ ratio greater than about 5. The deposited TiN film is then treated in a hydrogen-containing plasma such as that generated from molecular hydrogen (H$_2$). This results in a thick titanium nitride film with low resistivity and good step coverage. The deposition and plasma treatment steps may be repeated for additional cycles to form a thick, composite titanium nitride film of desired thickness, which is suitable for use in plug fill or capacitor structure applications.

18 Claims, 5 Drawing Sheets

U.S. PATENT DOCUMENTS

| | | | | |
|---|---|---|---|---|
| 5,416,045 A | | 5/1995 | Kauffman et al. | 437/174 |
| 5,420,072 A | * | 5/1995 | Fiordalice et al. | 437/192 |
| 5,567,483 A | * | 10/1996 | Foster et al. | |
| 5,593,511 A | | 1/1997 | Foster et al. | 148/238 |
| 5,610,106 A | | 3/1997 | Foster et al. | 437/245 |
| 5,665,640 A | | 9/1997 | Foster et al. | 438/680 |
| 5,866,213 A | * | 2/1999 | Foster et al. | 427/573 |
| 5,956,595 A | * | 9/1999 | Zenke | |
| 5,970,378 A | | 10/1999 | Shue et al. | 438/656 |
| 6,200,844 B1 | * | 3/2001 | Huang | |

OTHER PUBLICATIONS

Gross et al. "Effect of NH, Plasma Treatment on Etching of Ti During $TiCl_4$ –Based TiN CVD Processes" Mat. Res. Soc. Symp. Proc., vol. 514, pps. 523–529, 1998.

Buiting et al "Kinetical Aspects of the LPCVD of Titanium Nitride from Titanium Tetrachloride and Amonia" J. Electrochem. Soc., vol. 138, No. 2, pps. 500–505, Feb. 1991.

Mori et al. "Contact Plug Formed with Chemical–Vapour –Deposited TiN" Abstracts of the 1991 International Conference on Solid State Devices and Materials, pps. 210–212, 1991.

Yokoyama et al. "LPCVD Titanium Nitride for ULSIs" J. Electrochem Soc., vol. 138, No. 1, pps. 190–195, Jan. 1991.

Kurtz e t al. "Chemical Vapor Deposition of Titanium Nitride at Low Temperatures" Thin Solid Films, vol. 140, pps. 277–290, 1985.

Kim et al "The Effect of In–Situ N2/H2 Plasma Treatment on the Properties of Chemically Vapor Deposited TiN" Electrochemical Society Proceedings, vol. 97–25, pp. 1626–1633 (1997).

Kim et al "Effect of $N_2/H_2$ Plasma Treatment on the Properties in TiN Films Prepared by Chemical Vapor Deposition from $TiCl_4$ and $NH_3$", Jpan. J. Appl. Phys., vol. 38, pp. 461–463, Part 2, No. 4B, Apr. 15, 1999.

Konecni et al "A Stable Plasma Treated CVD Titanium Nitride Film for Barrier/Glue Layer Applications" VMIC Conference, pp. 181–183, Jun. 18–20, 1996.

Arena et al "A New Low Temperature PECVD TiN Compatible with Multilevel Vias Application" VMIC Conference, pp. 566–571, Jun. 18–20, 1996.

* cited by examiner

PLASMA TREATMENT OF A TITANIUM NITRIDE FILM FORMED BY CHEMICAL VAPOR DEPOSITION

CROSS REFERENCE TO RELATED APPLICATIONS

This application is a continuation-in-part of commonly assigned U.S. patent application, Ser. No. 09/330,696, entitled "Method of Depositing a Thick Titanium Nitride Film", filed on Jun. 11, 1999, which is incorporated herein by reference.

BACKGROUND OF THE DISCLOSURE

1. Field of the Invention

The invention relates to a method of titanium nitride film deposition and, more particularly, to a method of forming a thick, low stress titanium nitride film having low resistivity.

2. Description of the Background Art

In the manufacture of integrated circuits, a titanium nitride film is often used as a metal barrier layer to inhibit the diffusion of metals into an underlying region beneath the barrier layer. These underlying regions include transistor gates, capacitor dielectric, semiconductor substrates, metal lines, and many other structures that appear in integrated circuits.

A combination of titanium/titanium nitride (Ti/TiN) is often used as a diffusion barrier and provides contacts to the source and drain of a transistor. In forming a contact using a tungsten (W) plug process, for example, a Ti layer is deposited upon a silicon (Si) substrate, followed by conversion of the Ti layer into titanium silicide ($TiSi_x$), which provides a lower resistance contact with Si. A TiN layer is then formed upon the $TiSi_x$ layer, prior to forming the tungsten plug. Alternatively, in some applications, a TiN plug may also be formed instead of a W plug.

Ti and TiN films can be formed by physical or chemical vapor deposition. A Ti/TiN combination layer may be formed in a multiple chamber "cluster tool" by depositing a Ti film in one chamber followed by TiN film deposition in another chamber. When depositing both Ti and TiN using chemical vapor deposition (CVD), titanium tetrachloride ($TiCl_4$), for example, may be used to form both Ti and TiN films when allowed to react with different reactant gases, i.e., under plasma conditions, Ti is formed when $TiCl_4$ reacts with $H_2$, and TiN is formed when $TiCl_4$ reacts with nitrogen. In general, TiN can be formed by reacting $TiCl_4$ with a nitrogen-containing compound under either plasma or thermal conditions, depending on the specific nitrogen-containing compound. Thus, a TiN film may be formed by high temperature CVD using a reaction between $TiCl_4$ and ammonia ($NH_3$). However, thicker TiN films deposited using some prior art processes tend to develop cracks, especially when the film thickness exceeds about 400 Å. With increasing film thickness, both the density and size of the cracks increase, until the film eventually peels off.

Furthermore, when a TiN film is deposited from a $TiCl_4$-based chemical process, chlorine (Cl) is entrained in the TiN layer. The Cl content has been associated with an increase in film resistivity, which in turn results in an undesirable increase in contact resistance. For TiN plug applications, a TiN film thickness of over 1000 Å is often required, and a reduction of film resistivity becomes even more important.

Although the Cl content in the deposited TiN film can be reduced by increasing the deposition temperature, improved step coverage is favored by lowering the deposition temperature. Furthermore, a relatively low deposition temperature is advantageous for process integration purposes. For example, TiN can be used as a barrier layer for an upper electrode in a capacitor structure with tantalum pentoxide ($Ta_2O_5$) as the dielectric. However, thermal CVD of TiN— e.g., using a reaction between $TiCl_4$ and $NH_3$, is often performed at a temperature of about 650° C. Such a high temperature may cause undesirable atomic inter-diffusion within the capacitor structure.

Therefore, a need exists in the art for a method of depositing TiN at a reduced temperature, to yield thick, crack-free TiN films having improved properties including good step coverage and low resistivity.

SUMMARY OF THE INVENTION

The present invention is a method of forming a titanium nitride (TiN) layer using a reaction between ammonia ($NH_3$) and titanium tetrachloride ($TiCl_4$) at a pressure of about 10 to about 50 torr and a temperature of less than about 600° C., followed by treating the TiN layer in a hydrogen-containing plasma.

In one embodiment of the present invention, the TiN layer is formed at a pressure of about 20 torr and a temperature between about 550° C. and about 600° C. at an $NH_3$:$TiCl_4$ flow ratio of about 8.5, followed by in situ plasma treatment in the presence of $H_2$. Under these process conditions, a TiN layer of at least 250 Å can be formed. By repeating the TiN deposition and plasma treatment for additional cycles, a composite TiN layer of desired thickness can be formed for plug-fill applications. The method of the present invention can also be used to form a TiN layer as part of an upper electrode in a capacitor structure. The treatment of the TiN layer may be performed using a radio-frequency (RF) local plasma or a remote plasma.

In an alternative embodiment, alternate TiN layers can be formed using different deposition conditions. For example, a second TiN layer having step coverage and/or stress characteristics different from the first TiN layer may be formed by using an $NH_3$:$TiCl_4$ flow ratio that is different from that used in the first TiN layer. By alternating between deposition and treatment of the first and second TiN layers using different processing conditions, a composite TiN layer of final desired thickness can be achieved, with improved overall step coverage and stress characteristics.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

The present invention provides a method of forming a thick titanium nitride (TiN is used generically to include films of different stoichiometries) film with low resistivity and good step coverage. A thick TiN film, for example, may be used for plug applications in sub-0.18 μm technology. Embodiments of the invention allow relatively thick TiN films with low resistivity to be formed using a reaction between $NH_3$ and $TiCl_4$ at a reduced deposition temperature.

In one embodiment, a TiN layer is deposited at an $NH_3$:$TiCl_4$ flow ratio in the range of about 2.5 to about 17, typically above 5, and more preferably, about 8.5, and a process temperature of less than about 600° C., or preferably about 580° C. The deposited TiN layer, having a thickness of up to about 300 Å, is then exposed to a hydrogen-containing plasma. The plasma-treated TiN layer has a reduced resistivity compared to the as-deposited TiN layer due to a lower Cl content.

Alternatively, the TiN layer may be deposited in a two-step procedure, in which a relatively thin TiN layer, e.g., less than about 20 Å, is deposited using a first $NH_3$:$TiCl_4$ flow ratio, followed by deposition of a second TiN layer using a second $NH_3$:$TiCl_4$ flow ratio. The resulting TiN layer is then treated in a hydrogen-containing plasma to yield a thick TiN layer with reduced resistivity.

Depending on the specific application, the film deposition and plasma treatment steps can be repeated for additional cycles to yield a composite TiN layer. For example, a thick TiN layer can be obtained for thicknesses above 1000 Å. The composite TiN layer typically has.a resistivity of less than about 200 μohm-cm, and is well-suited for plug-fill applications for geometries below 0.18 μm.

System 10

Figure 1:
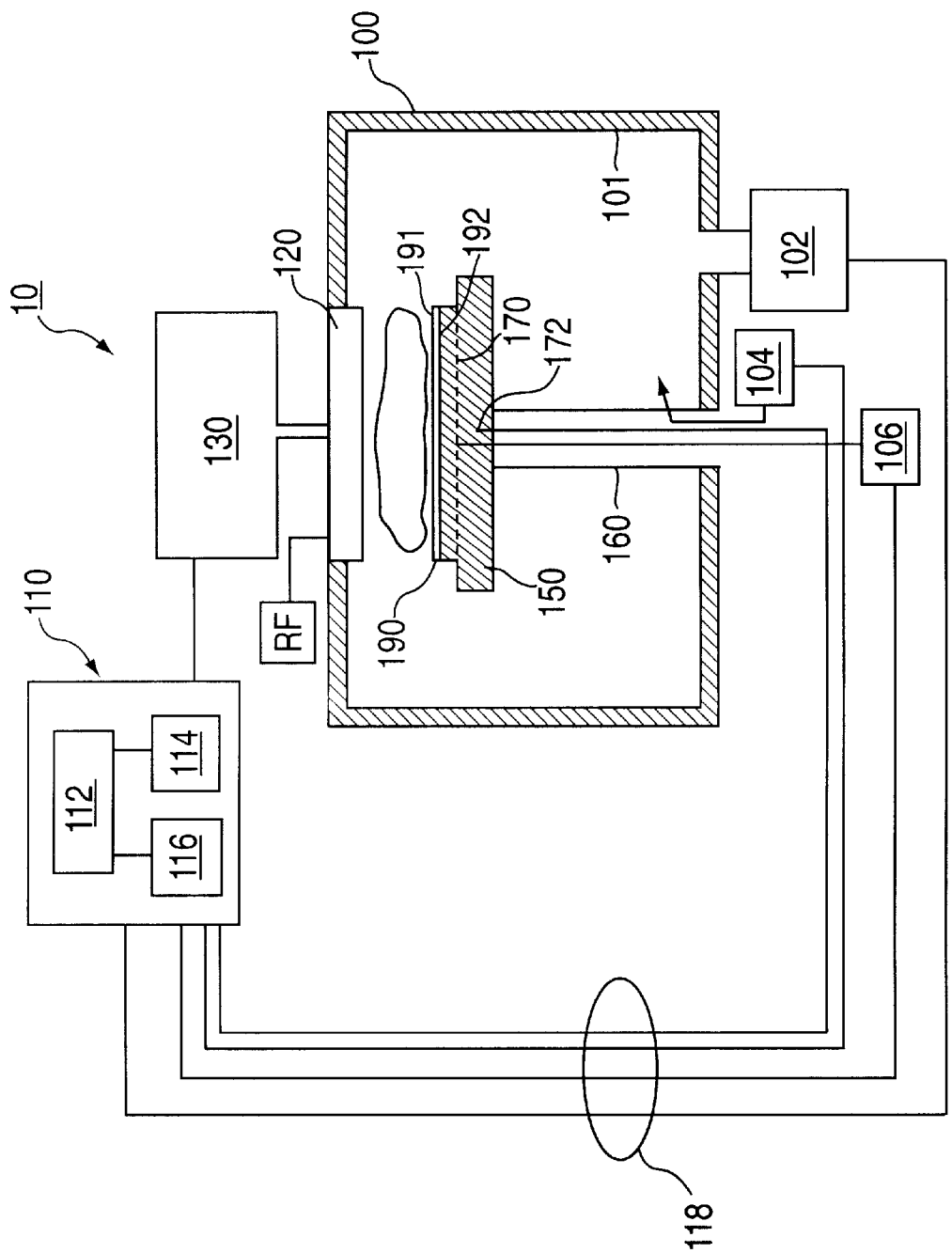
FIG. 1 is a schematic illustration of an apparatus that can be used to practice this invention.

FIG. 1 is a schematic representation of a wafer processing system 10 that can be used to practice embodiments of the present invention. The system 10 comprises a process chamber 100, a gas panel 130, a control unit 110, along with other hardware components such as power supplies and vacuum pumps. One example of the process chamber 100 is a TiN chamber, which has previously been described in a commonly-assigned U.S. patent application entitled "High Temperature Chemical Vapor Deposition Chamber," Ser. No. 09/211,998, filed on Dec. 14, 1998, and is herein incorporated by reference. Some key features of the system 10 are briefly described below.

Chamber 100

The process chamber 100 generally comprises a support pedestal 150, which is used to support a substrate such as a semiconductor wafer 190 within the process chamber 100. This pedestal 150 can be moved in a vertical direction inside the chamber 100 using a displacement mechanism (not shown). Depending on the specific process, the wafer substrate 190 has to be heated to some desired temperature prior to processing. In the present invention, the wafer support pedestal 150 is heated by an embedded heater 170. For example, the pedestal 150 may be resistively heated by applying an electric current from an AC supply 106 to the heater element 170. The wafer 190 is, in turn, heated by the pedestal 150, and can be maintained within a process temperature range of, for example, 400–750° C. A temperature sensor 172, such as a thermocouple, is also embedded in the wafer support pedestal 150 to monitor the temperature of the pedestal 150 in a conventional manner. For example, the measured temperature may be used in a feedback loop to control the power supply 106 for the heating element 170 such that the wafer temperature can be maintained or controlled at a desired temperature that is suitable for the particular process application.

Proper control and regulation of the gas flows through the gas panel 130 is performed by mass flow controllers (not shown) and a controller unit 110 such as a computer. The showerhead 120 allows process gases from the gas panel 130 to be uniformly distributed and introduced into the chamber 100. Illustratively, the control unit 110 comprises a central processing unit (CPU) 112, support circuitry 114, and memories containing associated control software 116. This control unit 110 is responsible for automated control of the numerous steps required for wafer processing—such as wafer transport, gas flow control, temperature control, chamber evacuation, and so on. Bi-directional communications between the control unit 110 and the various components of the system 10 are handled through numerous signal cables collectively referred to as signal buses 118, some of which are illustrated in FIG. 1.

A vacuum pump 102 is used to evacuate the process chamber 100 and to maintain the proper gas flows and pressure inside the chamber 100. A showerhead 120, through which process gases are introduced into the chamber 100, is located above the wafer support pedestal 150. The "dual-gas" showerhead 120 used in the present invention has two separate pathways, which allow two gases to be separately introduced into the chamber 100 without premixing. Details of the showerhead 120 have been disclosed in a commonly-assigned U.S. patent application entitled "Dual Gas Faceplate for a Showerhead in a Semiconductor Wafer Processing System," Ser. No. 09/098,969, filed Jun. 16, 1998; and is herein incorporated by reference. This showerhead 120 is connected to a gas panel 130 which controls and supplies, through mass flow controllers (not shown), various gases used in different steps of the process sequence. During wafer processing, a purge gas supply 104 also provides a purge gas, for example, an inert gas, around the bottom of the pedestal 150 to minimize undesirable deposits from forming on the pedestal 150.

TiN Film Deposition

An ideal TiN film should have low stress and good step coverage, especially for plug filling applications involving small geometries at or below 0.18 μm. Proper adjustment of deposition process conditions are required to provide a film with optimal, desirable characteristics. In the deposition of TiN using a reaction between $NH_3$ and $TiCl_4$, for example, the $NH_3$:$TiCl_4$ ratio can be adjusted to provide TiN films with varying step coverage and stress characteristics.

In a typical TiN deposition process, a pedestal temperature of over 650° C. is often used at a typical $NH_3$:$TiCl_4$ ratio of about 5. This results in a TiN film having a tensile stress on the order of $2 \times 10^{10}$ dyne/cm$^2$ for a 200 Å thick film. Cracks begin to develop in these films that are about 400 Å thick. In general, TiN film stress can be reduced by lowering the deposition temperature and/or increasing the $NH_3$:$TiCl_4$ ratio. However, an increased $NH_3$:$TiCl_4$ ratio also leads to a decreased step coverage.

A commonly-assigned application, Ser. No. 09/330,696, entitled "Method of Depositing a Thick Titanium Nitride Film", filed on Jun. 11, 1999, discloses a method of forming a thick crack-free TiN layer using a reaction between $NH_3$ and $TiCl_4$, and is herein incorporated by reference.

The present invention provides another embodiment of forming a thick, low stress TiN layer with good step coverage and low resistivity. In particular, the method includes the following features: 1) a relatively low deposition temperature of less than about 600° C.; 2) an $NH_3:TiCl_4$ ratio of at least about 5, preferably about 8.5; and 3) $H_2$ plasma treatment of the deposited film.

Two alternative TiN film deposition recipes are illustrated in Table 1.

TABLE 1

Process Parameters for TiN Deposition

| | Process (a) | | Process (b) | |
|---|---|---|---|---|
| | Preferred | (range) | Preferred | (range) |
| $NH_3$ (sccm) | 100 | (30–200) | 150 | (100–500) |
| $N_2$ (sccm) | 2000 | (1000–5000) | 2000 | (1000–5000) |
| $TiCl_4$ (sccm) | 12 | (3–25) | 1.8 | (1–6) |
| $N_2$ (sccm) | 1000 | (500–2500) | 1000 | (500–2500) |
| He (sccm) | 1000 | (500–2500) | 1000 | (500–2500) |
| $NH_3:TiCl_4$ | 8.5 | (2.5–17) | 85 | (20–250) |
| Pedestal Temp. (° C.) | 580 | (400–600) | 580 | (400–600) |
| Pressure (torr) | 20 | (5–50) | 20 | (5–50) |
| Ar Purge (sccm) | 2000 | (1000–5000) | 2000 | (1000–5000) |

Figure 2A:
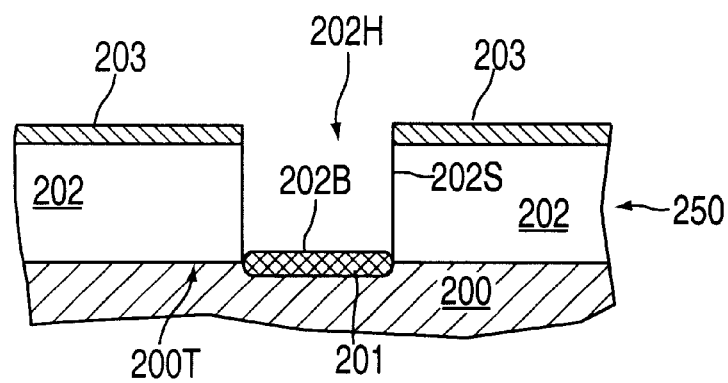
FIGS. 2a–2c depict schematic cross-sectional views of a substrate structure with a titanium nitride layer being formed according to one aspect of the present invention.
Figure 2B:
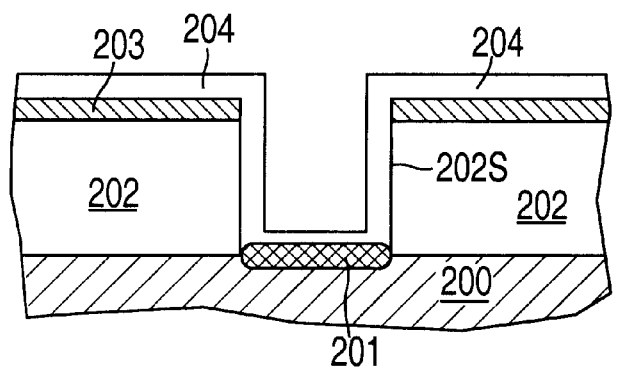
Figure 2C:
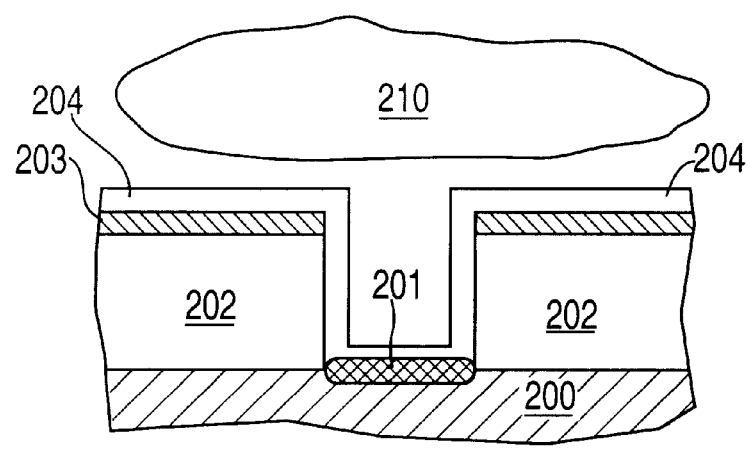

FIGS. 2a–c illustrate schematically cross-sectional views of a substrate 200 at different stages of an integrated circuit fabrication sequence. In general, the substrate 200 refers to any workpiece upon which film processing is performed, and a substrate structure 250 is used to generally denote the substrate 200 together with other material layers formed upon the substrate 200. Depending on the specific stage of processing, the substrate 200 may correspond to a silicon semiconductor wafer, or other material layer which has been formed upon the wafer. FIG. 2a, for example, illustrates a cross-sectional view of a substrate structure 250, having a material layer 202 that has been conventionally formed and patterned (e.g., by lithography and etch) upon the substrate 200. The material layer 202 may be an oxide (e.g., $SiO_2$), that has been patterned to form a contact hole 202H extending to the top surface 200T of the substrate 200. In general, the substrate 200 may be a layer of silicon, silicides, or other materials. FIG. 2a illustrates one embodiment in which the substrate 200 is silicon, and a silicide layer 201, e.g., titanium silicide ($TiSi_x$), among others, has been formed at the bottom 202B of the contact hole 202H. The $TiSi_x$ layer 201 may be formed, for example, by depositing Ti (e.g., by physical vapor deposition or CVD) over the silicon substrate 200 and the patterned oxide 202, followed by a high temperature anneal, which results in the formation of the $TiSi_x$ layer 201. The unreacted Ti layer 203 remains over the top 202T of the oxide layer 202 (no Ti is formed at the side 202S of the contact hole 202H because of non-conformal Ti deposition.) FIG. 2b depicts a TiN layer 204 deposited upon the substrate structure 250 of FIG. 2a.

In one embodiment of the present invention, the TiN film 204 is formed in a CVD chamber similar to chamber 100 of FIG. 1, using a reaction between $NH_3$ and $TiCl_4$ according to the recipe of process (a) in Table 1. After a wafer 190 having the substrate structure 250 is loaded onto the wafer support pedestal 150, $NH_3$ and $TiCl_4$, along with other gases, are introduced into the chamber 100 for TiN film deposition. $TiCl_4$ is introduced, along with helium (He) and nitrogen ($N_2$), via one gas line (not shown) of the dual-gas showerhead 120. $TiCl_4$, being a liquid at room temperature, is delivered to the gas line using, for example, a liquid injection system (not shown). In general, the following gas flow ranges can be used—$TiCl_4$: about 3 to about 25 sccm (calibrated from liquid flow rate), He: about 500 to about 2500 sccm, and $N_2$: about 500 to about 2500 sccm. He and $N_2$ are generally referred to as "dilutant" gases. The use of He and $N_2$ is for illustrative purpose only, and other gases such as argon (Ar) and hydrogen ($H_2$) can also be used as dilutant gases. $NH_3$, in a flow range of about 30 to about 200 sccm, is introduced into the chamber 100, along with a dilutant gas such as $N_2$ in a range of about 1000 to about 5000 sccm, via the second gas line of the dual-gas showerhead 120. The dilutant gases in either gas line can comprise either a single gas, or more than one gas in different combinations or ratios, i.e., as a gas mixture. While the exact ratio or combination of dilutant gases is not critical to the practice of the invention, it is preferable that the some "balance" be maintained between the respective gas flows in the first and second gas lines. By maintaining approximately equal gas flows in the two gas lines, potential "back flow" problems can be avoided.

More preferably, the TiN deposition is performed at an $NH_3$ flow of about 100 sccm and $N_2$ flow of about 2000 sccm in the first gas line, and a $TiCl_4$ flow of about 12 sccm, $N_2$ flow of about 1000 sccm and He flow of about 1000 sccm in the second gas line. In general, an $NH_3:TiCl_4$ flow ratio of greater than about 5 is used, and preferably, about 8.5. A total pressure greater than about 5 torr, e.g., in a range of about 10 to about 50 torr, and preferably about 20 torr can be used; and a pedestal temperature is maintained at about 400–600° C., e.g., between 500–600° C., and more preferably about 550–600° C. Depending on the specific process conditions, the substrate temperature may be about 30–40° C. lower than the pedestal temperature. Furthermore, a bottom inert gas purge flow (e.g., Ar or other inert gases) of about 2000 sccm, or more generally, between about 1000 to about 5000 sccm, is also established via a separate gas line and a purge gas supply 104 provided at the bottom of the chamber 100. Aside from minimizing the accumulation of undesirable deposits at the back of the wafer support pedestal 150, the purge gas flow may also affect deposition uniformity.

Under these process conditions, a crack-free TiN layer 204, having a film stress of less than about $1 \times 10^{10}$ dynes/$cm^2$ can be formed with a step coverage of over 95% over a contact hole with a near-vertical sidewall and an aspect ratio of about 7. (Aspect ratio is defined in this illustration by the ratio of the depth d to the width w of the contact hole 202H.) Using this deposition process alone, the TiN layer 204 can be formed into a TiN plug (not shown) inside the contact hole 202H by an appropriate planarization technique, e.g., blanket etchback or chemical mechanical polishing. With a depositing temperature below about 600° C., step coverage can be improved for contact with high aspect ratios, e.g., over 7:1. For features with even higher aspect ratios, it may also be necessary to further improve the step coverage by decreasing the $NH_3:TiCl_4$ flow ratio.

It should be noted that the formation of a crack-free TiN film is not solely a function of film stress. Instead, the $NH_3:TiCl_4$ ratio at which deposition takes place also plays an important role. For example, films having the same film stress may exhibit different "cracking" behaviors if they are deposited using different $NH_3:TiCl_4$ ratios. This may be attributed to the different surface reactions during deposition and orientation of the deposited films.

Depending on the deposition temperature and the $NH_3:TiCl_4$ ratio, the as-deposited TiN film may have a chlorine content as high as about 5%. In accordance with the present invention, the TiN layer 204 is subjected to a plasma treatment step, as illustrated in FIG. 2c. In particular, the TiN layer 204, e.g., having a thickness up to about 300 Å, is exposed to a hydrogen-containing plasma 210 by applying a RF power to the showerhead 120 of chamber 100. The hydrogen-containing plasma 210 is preferably generated from molecular $H_2$ gas, but may optionally contain nitrogen ($N_2$). Other hydrogen-containing, organic or inorganic precursors, e.g., ammonia gas ($NH_3$), methane ($CH_4$), among others, may also be used in generating the hydrogen-containing plasma 210. It is believed that the exposure of the TiN layer 204 to the plasma results in an interaction between atomic hydrogen (e.g., may include both atomic neutrals and ions) and the chlorine species in the TiN layer 204. It is further believed that the film treatment relies more on chemical interactions rather than ion bombardment. Thus, according to the present invention, the film treatment can also be performed under a remote plasma environment, in addition to a local plasma generated in the vicinity of the substrate.

Figure 5:
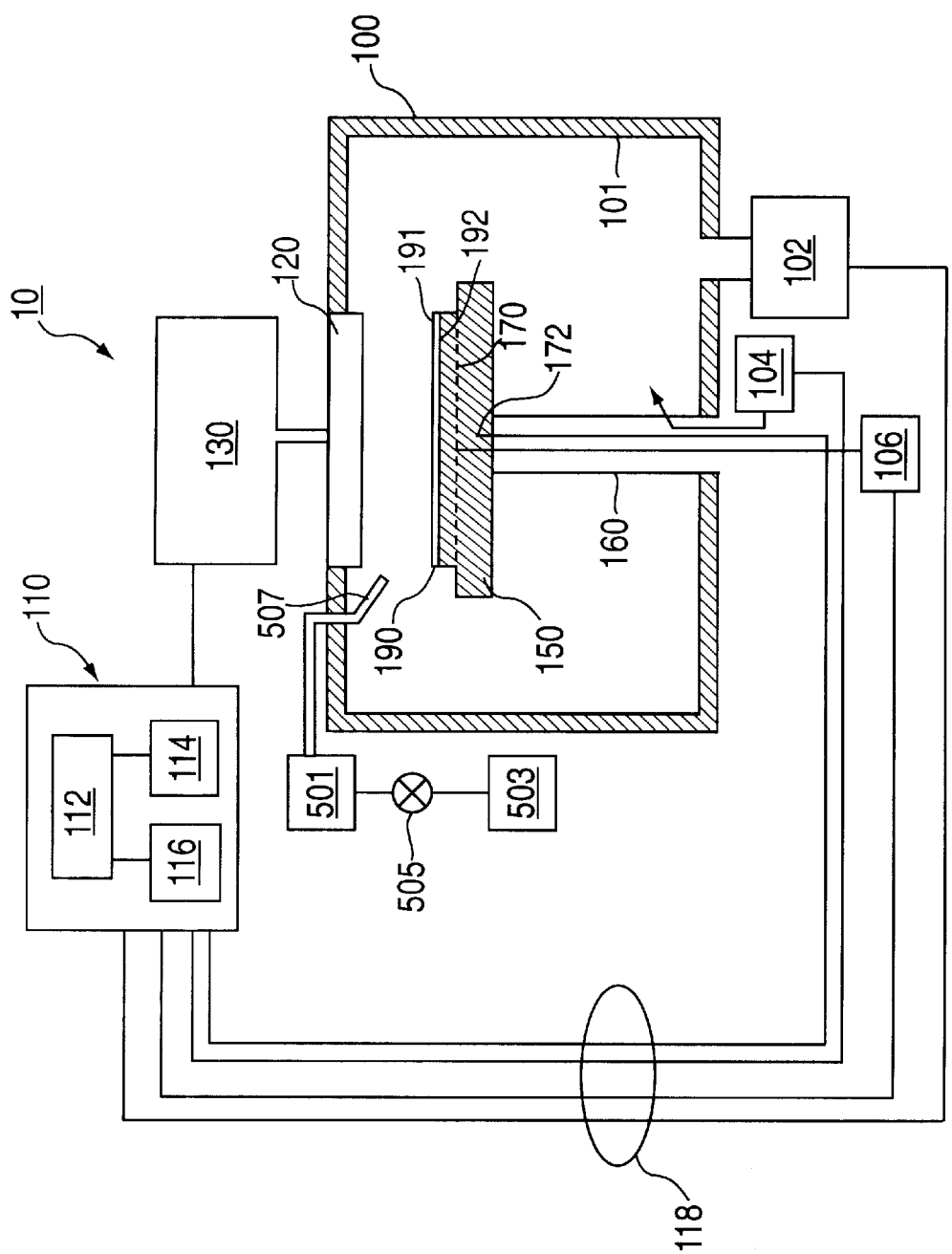
FIG. 5 depicts a schematic illustration of an alternative embodiment of the apparatus of FIG. 1 that can be used to practice this invention.

FIG. 5 illustrates schematically a remote plasma source 501 connected to the chamber 100 for treating a wafer 190 containing the TiN layer 204 of FIG. 2c. For example, a remote plasma may be generated by microwave or RF excitation of a plasma source gas (e.g., a hydrogen-containing gas, along with an inert gas such as argon). A gas flow controller 505 controls the supply of the plasma source gas from a gas supply 503 to the remote plasma source 501. The radical species generated in the remote plasma source 501, e.g., atomic hydrogen, are introduced into the chamber 100 at an inlet 507. Chemical interactions occur between radicals from the plasma and chlorine species in the TiN layer 204, resulting in the treatment of the TiN layer 204.

Table 2 illustrates the typical process conditions for the $H_2$ plasma treatment—$H_2$ flow rate in the range of about 500–5000 sccm, or preferably about 2000 sccm; a pressure range of about 0.5–10 torr, or preferably about 5 torr, with an RF power in the range of about 600–900 W, or preferably about 600 W. Alternatively, a $H_2/N_2$ plasma may also be used, for example, with a $N_2$ flow rate in the range of about 500–5000 sccm. The $N_2/H_2$ flow ratio is typically maintained in a range of about 0–2, and preferably, about 1; and a 40 seconds treatment time is typically used for a 300 Å thick TiN film. A shorter treatment time may suffice for a thinner TiN film. Optionally, other inert gases, such as Ar or helium (He) may also be added to the treatment plasma. For treatment using a remote plasma, the process conditions (e.g., plasma power, gas flow rate, pressure, and so on) may be adjusted to provide a sufficient amount of atomic hydrogen to reach the TiN layer 204 for effective treatment. The amount of radical species needed for such treatment may be found by experimentation by one skilled in the art.

TABLE 2

Plasma Treatment Process Parameters

| | Plasma Treatment | |
| --- | --- | --- |
| | Preferred | (range) |
| $H_2$ (sccm) | 2000 | (500–5000) |
| $N_2$ (sccm) (optional) | 2000 | (500–5000) |
| Pedestal Temp. (° C.) | 580 | (400–600) |
| Pressure (torr) | 5 | (0.5–10) |
| RF power (W) | 600 | (600–900) |
| Ar Purge (sccm) | 500 | (200–1000) |

The plasma treatment using a hydrogen-containing plasma, such as that generated from $H_2$, is more effective in reducing the Cl content in TiN films compared to thermal annealing in $NH_3$. For example, at a temperature of about 580° C., a TiN film has a Cl concentration of about 3% after $NH_3$ thermal anneal, compared to about 1.5% after a $H_2/N_2$ plasma treatment. Typically, the resistivity of a TiN film treated in a $H_2/N_2$ plasma, or more generally, a plasma comprising hydrogen and nitrogen, at about 580° C. is less than about 200–230 $\mu$ohm-cm. In one embodiment, for example, a TiN film treated with a plasma comprising hydrogen has a resistivity of about 180 $\mu$ohm-cm, compared to about 320 $\mu$ohm-cm after $NH_3$ thermal anneal.

A more favorable aging effect is also observed for TiN films treated with a hydrogen-containing plasma compared to thermal anneal with $NH_3$. For example, TiN films treated with a $H_2$ plasma exhibit less than 4% increase in sheet resistance after 24 hours, while other TiN films of the same thickness treated by thermal annealing in $NH_3$ show an increase of about 40%.

In certain embodiments, it is observed that after the plasma treatments, the stoichiometry or Ti:N ratio of the TiN film has not been modified, and there is no significant film densification. However, since the TiN film deposited at a relatively low temperature tends to be amorphous or micro-crystalline, the plasma treatment may have the effect of enhancing the TiN grain size, or causing minor changes in the crystal orientation.

Figure 3A:
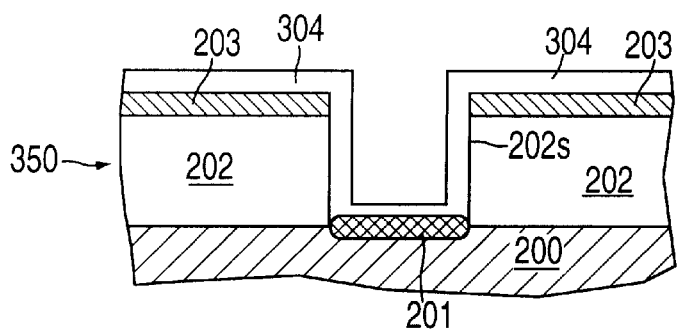
FIGS. 3a–3d depict schematic cross-sectional views of a substrate structure at different stages of integrated circuit fabrication, in which a composite titanium nitride layer is formed according to another embodiment of the present invention.
Figure 3B:
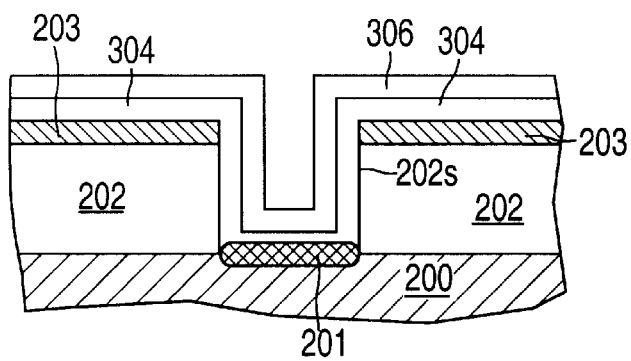
Figure 3C:
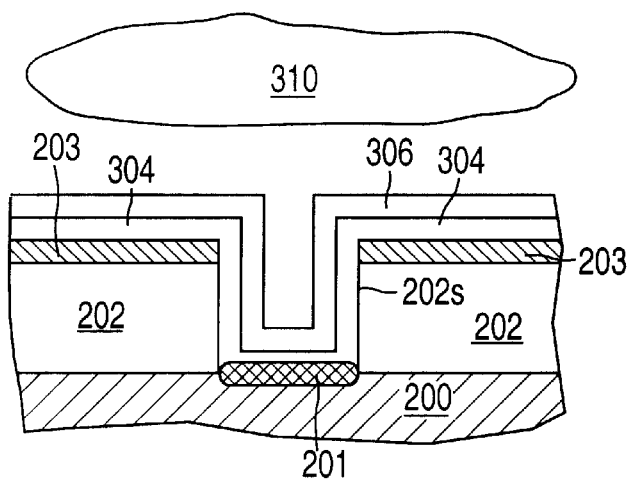
Figure 3D:
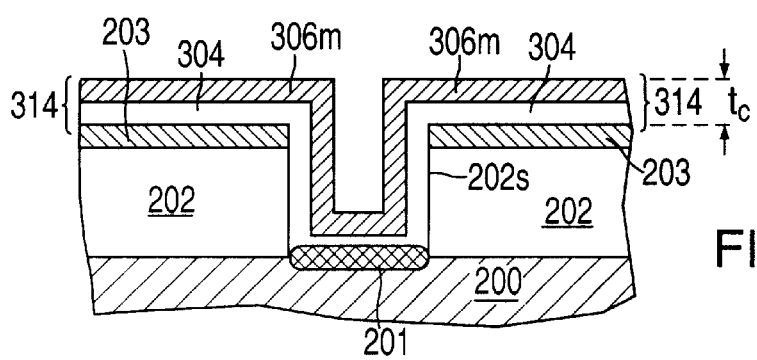

In another aspect of the invention, the film deposition and plasma treatment steps are performed in different sequence combinations in order to achieve various desirable film properties. One specific fabrication sequence, for example, involves the formation of a composite TiN layer using a two-step procedure that uses different deposition conditions in the two process steps. This process sequence is illustrated in FIGS. 3a–d. FIG. 3a shows the deposition of a first TiN layer 304 upon a substrate structure 350 similar to that shown in FIG. 2c. The TiN layer 304 is preferably a relatively low stress film that is also relatively thin, e.g., less than about 20–25 Å. For example, the recipe of process (b), shown in Table 1, may be used to deposit this layer 304 at a temperature of less than about 600° C. An $NH_3$:$TiCl_4$ flow ratio of greater than about 20, preferably 40, or more preferably 85, is used in this step to provide a first layer with relatively low stress. In the second step of the process sequence, a second TiN layer 306 is deposited upon the first layer 304, as shown in FIG. 3b. The second TiN layer 306 is preferably deposited under process conditions that favor a good step coverage, for example, at an $NH_3$:$TiCl_4$ flow ratio greater than about 5, or more preferably about 8.5, as shown in the process recipe (a) of Table 1. This second TiN layer 306 may be deposited to a thickness up to about 300 Å, and may have a film stress that is higher than that of layer 304. FIG. 3c shows the as-deposited TiN layer 306 being exposed to a hydrogen-containing plasma 310, such as that generated from $H_2$. This plasma treatment results in a composite TiN layer 314 shown in FIG. 3d, comprising the plasma treated or modified layer 306m, which has a reduced Cl content compared to the as-deposited layer 306 of FIG. 3c, and the underlying TiN layer 304. Depending on the specific plasma condition and the thickness of the second TiN layer 306, the underlying layer 304 may or may not be treated by the plasma. For example, if the layer 306 has a thickness less than about 250 Å, the layer 304 will be partially treated by the plasma 310. For a layer 306 thicker than about 250 Å, the layer 304 will probably not be treated. However, since the first TiN layer 304 has a lower chlorine content than the second TiN layer 306 (layer 304 is deposited under a higher $NH_3$:$TiCl_4$ ratio condition), whether the layer 304 is plasma treated or not will not significantly affect the resistivity of the composite layer 314. After plasma treatment according to the embodiments of the present invention, there is no noticeable film densification, and the composite layer thickness $t_c$ is approximately equal to the sum of the thickness of the as-deposited TiN layers 304 and 306. Additional cycles of film deposition and plasma treatment can be performed as needed to form a composite TiN layer of desired thickness. In accordance with the present invention, for example, a crack-free, TiN layer 314 having a thickness of over 1000 Å can be fabricated for use in plug fill applications.

In general, a composite TiN layer of desired thickness may be formed from an aggregate of TiN component layers by repeating several cycles of film deposition and plasma treatment. Optimization of the deposition and plasma treatment conditions for individual TiN components layers will result in a composite TiN layer having the combined advantages of improved step coverage and reduced film stress.

Figure 4:
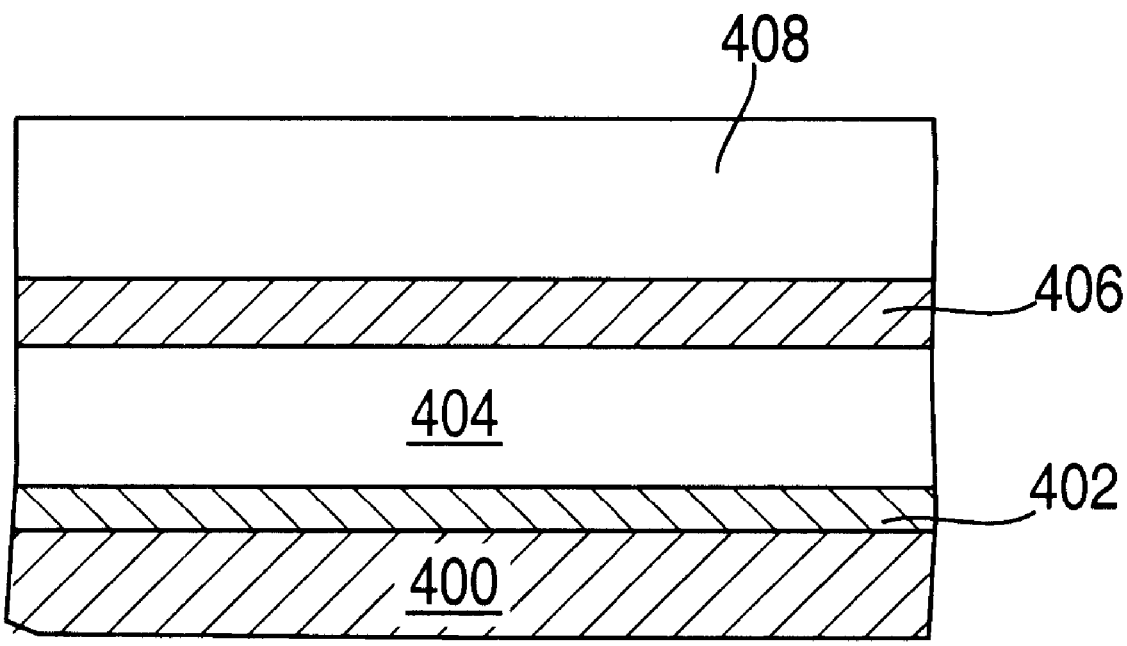
FIG. 4 depicts a cross-sectional view of a capacitor structure having a titanium nitride barrier layer that is formed in accordance with the present invention.

Aside from plug fill applications, the TiN layer formed by the present process may also be used as a barrier layer for an upper electrode in a capacitor structure having tantalum pentoxide ($Ta_2O_5$) as the dielectric. FIG. 4 illustrates a cross-sectional view of such a capacitor structure.

The bottom electrode 400 may comprise of silicon, e.g., polysilicon. A barrier layer 402 such as silicon nitride may also be used prior to the formation of the dielectric layer 404 comprising $Ta_2O_5$. Typically, $Ta_2O_5$ may be formed by a CVD process using a liquid source, e.g., tantalum-pentaethoxy (TAETO) or tantalum-tetraethoxydimethylamine (TATDMAE), at a temperature of less than about 450° C. A TiN barrier layer 406 is then formed upon the $Ta_2O_5$ dielectric layer 404, preferably at a low processing temperature so as to avoid undesirable inter-diffusion across the various material layers. This can be achieved, for example, by the process of the present invention. The TiN barrier layer 406 can be deposited using the recipe shown in Table 1, followed by treating in a plasma generated from $H_2$. An upper electrode layer 408, which may comprise polysilicon or other suitable conducting materials, is then formed upon the plasma treated TiN barrier layer 406, thus resulting in the capacitor structure of FIG. 4.

While the present invention is particularly well-suited for applications requiring thick film formation (e.g., plug fill), it is generally applicable to many other substrate structures encountered in various stages of integrated circuit fabrication, including liner/barrier, capacitor, and so on.

Although several preferred embodiments which incorporate the teachings of the present invention have been shown and described in detail, those skilled in the art can readily devise many other varied embodiments that still incorporate these teachings.

What is claimed is:

1. A method of depositing a titanium nitride layer, comprising the steps of:
   (a) forming a titanium nitride layer upon a substrate inside a processing chamber using a thermal reaction between ammonia ($NH_3$) and titanium tetrachloride ($TiCl_4$) at a pressure range of about 10 to about 50 torr and a temperature of less than about 600° C.; and
   (b) following said step (a), treating said titanium nitride layer in a plasma generated from a gas consisting of molecular hydrogen ($H_2$) without removing said substrate from said processing chamber, wherein the plasma is generated at a temperature between about 500° C. to about 600° C.

2. The method of claim 1, wherein said step (b) is performed at a pressure of about 0.5 torr. to about 10 torr.

3. The method of claim 1, wherein said step (a) is performed at an $NH_3$:$TiCl_4$ flow ratio greater than about 5.

4. The method of claim 1, wherein said titanium nitride layer formed in said step (a) has a thickness of less than about 300 Å.

5. The method of claim 1, wherein said titanium nitride layer has a film resistivity of less than about 200 μohm-cm after said step (b).

6. The method of claim 1, further comprising the step of:
   (c) repeating said steps (a) and (b) to form a composite titanium nitride layer having a thickness of at least 1000 Å, and a resistivity less than about 200 μohm-cm.

7. The method of claim 1, wherein said plasma of step (b) is a radio-frequency plasma.

8. The method of claim 1, wherein said plasma of step (b) is a remote plasma.

9. A method of depositing a titanium nitride layer comprising the steps of:
   (a) forming a first titanium nitride layer upon a substrate inside a processing chamber using a thermal reaction between ammonia ($NH_3$) and titanium tetrachloride ($TiCl_4$) at a first $NH_3$:$TiCl_4$ flow ratio of greater than about 20, within a pressure range of about 1.0 to about 50 torr and a temperature of less than about 600° C.;
   (b) forming a second titanium nitride layer upon said first titanium nitride layer of step (a) using a thermal reaction between $NH_3$ and $TiCl_4$ at a second $NH_3$:$TiCl_4$ flow ratio different from said first $NH_3$:$TiCl_4$ flow ratio used in said step (a); and
   (c) following said step (b), exposing said second titanium nitride layer to a plasma generated from a gas consisting of molecular hydrogen ($H_2$), without removing said substrate from said processing chamber.

10. The method of claim 9, wherein said first titanium nitride layer has a thickness less than about 20 Å, said second titanium nitride layer has a thickness of less than about 300 Å and said second $NH_3$:$TiCl_4$ flow ratio is greater than about 5.

11. The method of claim 9, wherein said steps (a), (b) and (c) are repeated for additional cycles to form a composite titanium nitride layer of thickness greater than about 1000 Å.

12. The method of claim 9, wherein said plasma of step (c) is a radio frequency plasma.

13. The method of claim 9, wherein the plasma of step (c) is a remote plasma.

14. A method of forming a capacitor structure, comprising the steps of:
   (a) forming a first electrode upon a substrate;
   (b) forming an insulating layer upon said first electrode;
   (c) forming a titanium nitride layer upon said insulating layer using a thermal reaction between ammonia ($NH_3$) and titanium tetrachloride ($TiCl_4$) at a pressure range of about 10 to about 50 torr and a temperature of less than about 600° C.;
   (d) exposing said titanium nitride layer formed in step (c) to a plasma generated from a gas consisting of molecular hydrogen ($H_2$); and
   (e) forming a second electrode upon said titanium nitride layer after step (d).

15. The method of claim 14, wherein said insulating layer of step (b) comprises tantalum pentoxide ($Ta_2O_5$).

16. The method of claim 14, wherein said step (c) is performed at an $NH_3$:$TiCl_4$ flow ratio greater than about 5.

17. The method of claim 14, wherein said first electrode comprises silicon.

18. The method of claim 14, wherein said second electrode comprises silicon.

* * * * *

UNITED STATES PATENT AND TRADEMARK OFFICE
CERTIFICATE OF CORRECTION

PATENT NO. : 6,555,183 B2  Page 1 of 1
DATED : April 29, 2003
INVENTOR(S) : Shulin Wang, Ming Xi, Zvi Lando and Mei Chang It is certified that error appears in the above-identified patent and that said Letters Patent is hereby corrected as shown below:

Column 10,
Line 20, please change "TiCl1$_4$)" to -- (TiCl$_4$) --.

Signed and Sealed this

Twenty-third Day of September, 2003

JAMES E. ROGAN
*Director of the United States Patent and Trademark Office*